United States Patent
Sun et al.

(10) Patent No.: US 7,300,869 B2
(45) Date of Patent: Nov. 27, 2007

(54) INTEGRATED BARRIER AND SEED LAYER FOR COPPER INTERCONNECT TECHNOLOGY

(75) Inventors: Sey-Shing Sun, Portland, OR (US); Byung-Sung L. Kwak, Portland, OR (US); Peter A. Burke, Portland, OR (US)

(73) Assignee: LSI Corporation, Milpitas, CA (US)

(*) Notice: Subject to any disclaimer, the term of this patent is extended or adjusted under 35 U.S.C. 154(b) by 324 days.

(21) Appl. No.: 10/945,777

(22) Filed: Sep. 20, 2004

(65) Prior Publication Data
US 2006/0063375 A1    Mar. 23, 2006

(51) Int. Cl.
H01L 21/4763 (2006.01)
H01L 29/45 (2006.01)

(52) U.S. Cl. .................. 438/648; 438/627; 257/751; 257/761

(58) Field of Classification Search .................. None
See application file for complete search history.

(56) References Cited

U.S. PATENT DOCUMENTS

| 5,969,422 | A * | 10/1999 | Ting et al. ............ 257/762 |
| 2003/0129826 | A1 * | 7/2003 | Werkhoven et al. ...... 438/627 |
| 2003/0203617 | A1 * | 10/2003 | Lane et al. ............ 438/627 |
| 2004/0108217 | A1 * | 6/2004 | Dubin ................. 205/291 |

OTHER PUBLICATIONS

The Electrochemical Society, Inc.: "Ruthenium-Based Copper Diffusion Barrier: Studied by Electrochemistry", SIMS Depth Profiling and Sheet Resistance Measurements 2003 Abs. 595 204th Meeting. Oliver Chyan, et al., Department of Chemistry, Department of Materials Sciene, University of North Texas, Denton, Texas (1 page).

The Journal of The Electrochemical Society: "Atomic Layer Deposition of Ruthenium Thin Films for Copper Glue Layer" 151 (2) G109-G112 (2004) 0013-4651/2004/151(2)/G109/4/$7.00 The Electrochemical Society, Inc. Oh-Kyum Kwon (a), Hyoung-Sang Park (b), et al. (a) Department of Materials Science and Engineering, Korea Advanced Institute of Science and Technology, Yusong-gu, Taejon 305-701. Korea (b) Genitech, Incorporation, Taedok-gu, Taejon 306-230, Korea (4 pages).

Entegris, Protecting and Transporting the Critical Materials Enabling the World's Leading Technologies: "Transition Metals Show Promise as Copper Barriers" Ishita Goswami and Ravi Laxman, ATMI, San Jose, May 1, 2004 Semiconductor International (6 pages) http://www.reed-eectronics.com/semiconductor/index.asp?layout.

* cited by examiner

Primary Examiner—Mary Wilczewski
Assistant Examiner—Pamela E Perkins
(74) Attorney, Agent, or Firm—Beyer Weaver LLP (57) ABSTRACT

An integrated barrier and seed layer that is useful for creating conductive pathways in semiconductor devices. The barrier portion of the integrated layer prevents diffusion of the conductive material into the underlying dielectric substrate while the seed portion provides an appropriate foundation upon which to deposit the conductive material. The barrier portion of the integrated layer is formed of a metal nitride, while the seed portion is formed of ruthenium or a ruthenium alloy. The metal nitride forms an effective barrier layer while the ruthenium or ruthenium alloy forms an effective seed layer for a metal such as copper. In some embodiments, the integrated layer is formed in a way so that its composition changes gradually from one region to the next.

24 Claims, 4 Drawing Sheets

INTEGRATED BARRIER AND SEED LAYER FOR COPPER INTERCONNECT TECHNOLOGY

FIELD OF THE INVENTION

The present invention relates generally to semiconductor device fabrication, and more specifically to copper interconnect technology.

BACKGROUND

Copper interconnect technology has been widely adopted for advanced high performance integrated circuit devices. Because copper (Cu) has a higher melting point than aluminum, it was expected that Cu would have improved current carrying capability and extended electro-migration lifetime. Conventionally, Cu metallization is formed by depositing a thin barrier metal layer, e.g., formed of tantalum-nitrate and tantalum (TaN/Ta), in the trenches or vias formed in dielectric layers by dry etching. A thin Cu metal seed layer then covers the barrier layer. The Cu seed layer is needed for subsequent electroplating of a Cu layer in order to completely fill the vias and trenches of the dielectric layers. Any overplated Cu layers are chemical mechanically polished back to leave Cu metallization in the trenches and vias. This Cu metallization process is repeated several times to form multi-layered circuits. For example, multiple dielectric layers with Cu metallization are typically stacked on top of a semiconductor wafer substrate. Each of the dielectric layers and corresponding Cu metallization are referred to as a "metal layer." The metal layers provide for electrical interconnectivity between integrated circuits within the semiconductor wafer substrate.

Although a proven technology, the tri-layer deposition of TaN/Ta—Cu does not scale well below 65 nm technology where a high resistance TaN/Ta barrier layer starts to occupy a greater fraction of conductor volume. In addition, deposition of Cu seed layers typically result in a relatively thick metal layer overhang near the opening of vias and trenches that prevent successful void free Cu electroplating in smaller features. Furthermore, the tri-layer deposition requires deposition in two separate processing (e.g., deposition) chambers and hence incurs higher production cost in terms of tool capital expenditure and yield loss. Cu may be deposited with various deposition techniques, such as sputtering and chemical vapor deposition. Therefore, efforts have been devoted to develop a direct Cu plate-able single layer barrier layer for future Cu interconnect technology.

Currently, ruthenium (Ru) is a leading candidate since it is an air stable transition metal with a high melting point (2310° C.) and is nearly twice as electrically conductive (7.6 uOhm-cm) as Ta (12.5 uOhm-cm). In addition, Ru, like Ta, shows negligible solubility with Cu even at 900° C. based on a binary phase diagram. Furthermore, researchers have demonstrated that it is possible to directly electroplate Cu over a very thin layer of Ru, e.g., less than 10 nm, and hence eliminate the need to deposit a so-called seed layer. Such a scheme, if implemented, would provide a significant increase in electrical performance while reducing the production cost by one-half (e.g., saving in tool cost and increase in yield).

Unfortunately, Ru is not a good barrier layer for Cu because it does not react with nitrogen to form an effective barrier layer. Normally, a metal nitride, if conductive, would be a better choice as a copper diffusion barrier than it's metal counterpart due to increased atomic packing density and inert nature. The maximum temperature before copper diffusion through Ru into silicon oxide is only 450° C., which is considerable inferior to TaN (at approximately >700° C.).

In view of the foregoing, there are continuing efforts to provide improved techniques for forming barrier and seed layers in semiconductor metallization processes.

BRIEF SUMMARY OF THE INVENTION

The present invention is directed to an integrated barrier and seed layer that is useful for creating conductive pathways in semiconductor devices. The barrier portion of the integrated layer prevents diffusion of the conductive material into the underlying dielectric substrate while the seed portion provides an appropriate foundation upon which to deposit the conductive material. The barrier portion of the integrated layer is formed of a metal nitride, while the seed portion is formed of ruthenium or a ruthenium alloy. The metal nitride forms an effective barrier layer while the ruthenium or ruthenium alloy forms an effective seed layer for a metal such as copper. In some embodiments, the integrated layer is formed in a way so that its composition changes gradually from one region to the next. Internal stress levels are reduced since there are no drastic changes in composition and physical properties.

As a method, one embodiment of the present invention includes at least providing a dielectric layer having a plurality of recessed vias and trenches, depositing a metal nitride over a surface of each of the vias and trenches to form a barrier layer, and depositing a ruthenium or a ruthenium alloy over the barrier layer to form a seed layer. In one embodiment, the metal nitride that forms the barrier layer is a ruthenium-tantalum-nitride. In another embodiment, the seed layer is formed of a ruthenium-tantalum alloy. In yet another embodiment, the metal nitride that forms the barrier layer is a tantalum-nitride and the copper seed layer is formed of substantially pure ruthenium. Furthermore, a transition layer can be formed of a ruthenium-tantalum-nitride between the barrier layer and the copper seed layer by depositing a ruthenium-tantalum-nitride after the operation of depositing the barrier layer and before the operation of depositing the copper seed layer.

As a method, an alternative embodiment includes at least providing a dielectric layer having a plurality of recessed vias and trenches and forming an integrated barrier and seed layer over at least each of the vias and trenches by first, depositing a metal nitride to form a barrier region and second, depositing a ruthenium or a ruthenium alloy over the barrier region to form a seed region, wherein the first and second depositing operations are performed in a single deposition chamber.

As an apparatus, one embodiment of the present invention includes at least a semiconductor substrate that contains integrated circuits, a dielectric layer formed above the semiconductor substrate, the dielectric layer having a plurality of recessed vias and trenches, an integrated barrier and seed layer that covers a surface of each of the vias and trenches, the integrated barrier and seed layer having a barrier region that is formed adjacent to the surface of the dielectric layer and a seed region that is formed above the barrier region, the barrier region being formed of a metal nitride and the seed region being formed of ruthenium or a ruthenium alloy.

As an apparatus, an alternative embodiment of the invention includes at least a semiconductor substrate that contains integrated circuits, a dielectric layer formed above the semiconductor substrate, the dielectric layer having a plurality of recessed vias and trenches, and an integrated barrier and seed layer that covers a surface of each of the vias and trenches, the integrated barrier and seed layer having a barrier region that is formed adjacent to the surface of the dielectric layer and a seed region that is formed above the barrier region, the barrier region being formed of a ruthenium-tantalum-nitride and the seed region being formed of a ruthenium-tantalum alloy.

As an apparatus, an alternative embodiment of the invention includes at least a semiconductor substrate that contains integrated circuits, a dielectric layer formed above the semiconductor substrate, the dielectric layer having a plurality of recessed vias and trenches, and an integrated barrier and seed layer that covers a surface of each of the, vias and trenches, the integrated barrier and seed layer having a barrier region that is formed adjacent to the surface of the dielectric layer, a transition region formed above the barrier region, and a seed region formed above the transition region, the barrier region being formed of a tantalum-nitride, the transition region formed of a ruthenium-tantalum-nitride, and the seed region being formed of substantially pure ruthenium.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

The present invention pertains to an integrated barrier and seed layer that is useful for creating conductive pathways in semiconductor devices. For example, the integrated barrier and seed layer is formed upon a dielectric substrate so that a conductive material can then be formed upon the integrated barrier and seed layer. The barrier portion of the integrated layer prevents diffusion of the conductive material into the underlying dielectric substrate while the seed portion provides an appropriate foundation upon which to deposit the conductive material. The barrier portion of the integrated layer is formed of a metal nitride, while the seed portion is formed of ruthenium or a ruthenium alloy. The metal nitride forms an effective barrier layer while the ruthenium or ruthenium alloy forms an effective seed layer for a metal such as copper. The integrated barrier and seed layer can be formed to be extremely thin since a single deposition tool can deposit both the barrier and the seed portions. The integrated layer is also very thin since very thin layers of ruthenium can be deposited. In contrast, copper seed layers are relatively thick due to the copper deposition processes. The integrated layer is formed in a way so that its composition changes gradually from one region to the next. Internal stress levels are reduced since there are no drastic changes in composition and physical properties.

The present invention will be described in relation to two primary embodiments. The first embodiment is described with the aid of FIGS. 1-3 and the second embodiment is described with the aid for FIGS. 4 and 5. However, note that variations in the integrated barrier and seed layer and in the process for forming the integrated layer are not excluded by the description of the two primary embodiments. Some of the variations will also be described throughout the description of the invention. Note that not all of the variations are discussed and it should be noted that variations that are in the spirit of the invention are also embraced by this disclosure.

Figure 1:
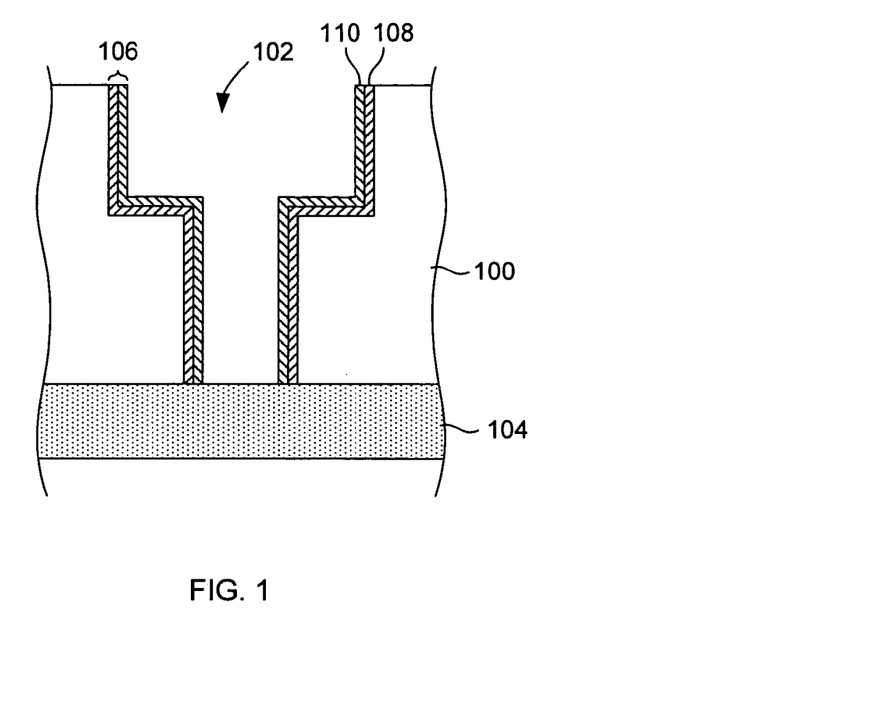
FIG. 1 illustrates a cross-sectional view of a via that is covered with an integrated barrier and seed layer according to one embodiment of the present invention.
Figure 2:
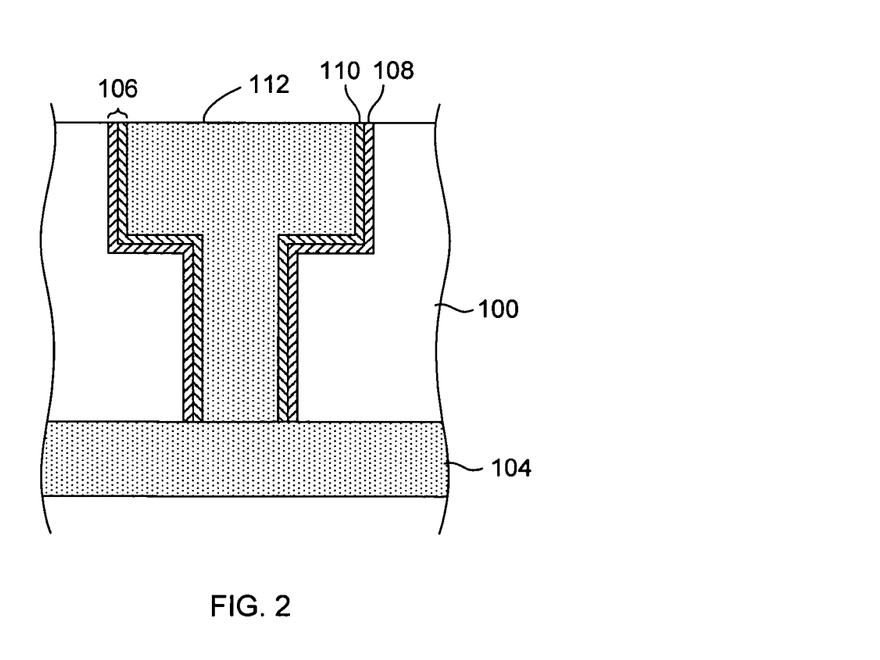
FIG. 2 illustrates the dielectric layer of FIG. 1 after the via has been filled with a conductive material to form an interconnect.
Figure 3:
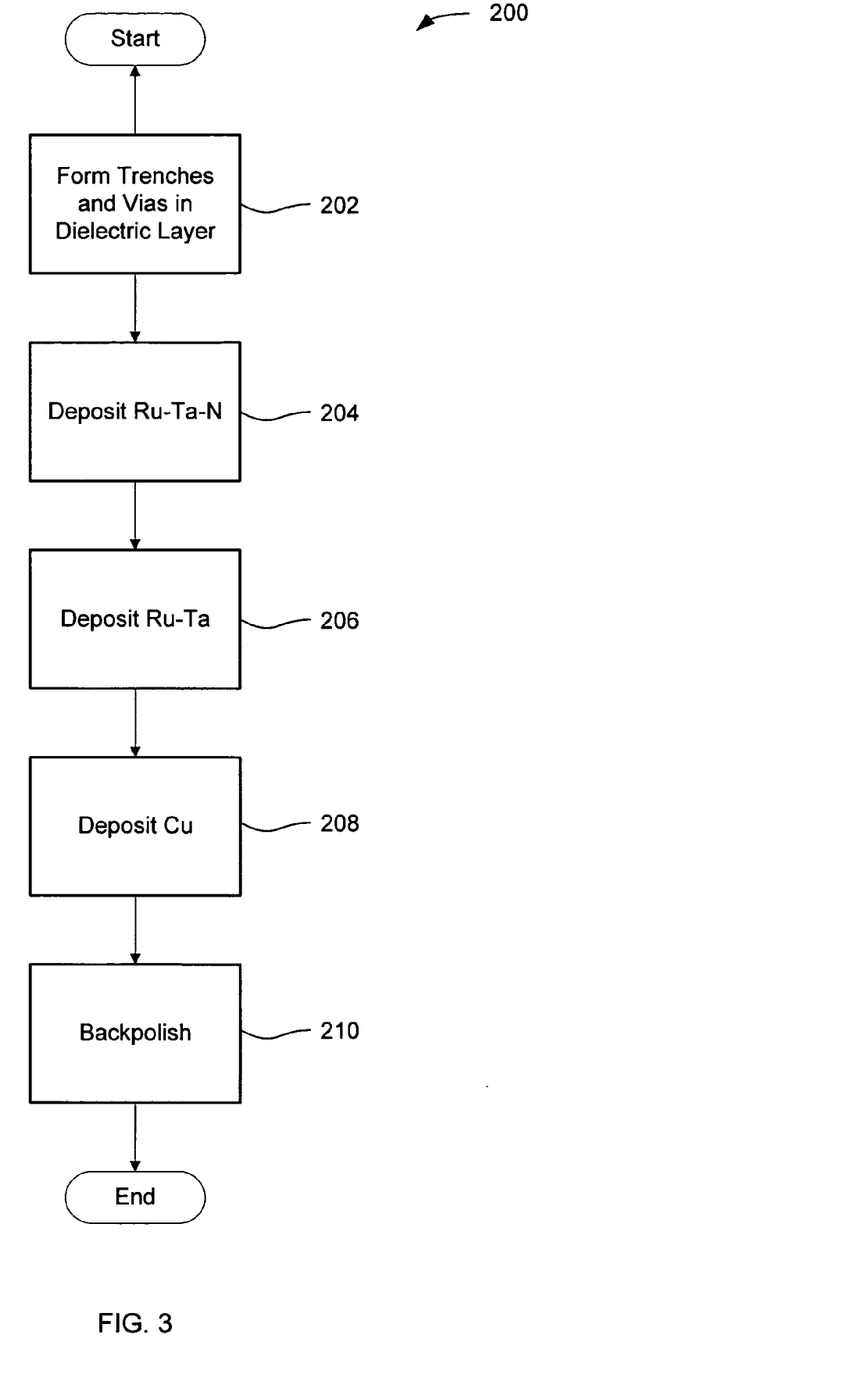
FIG. 3 illustrates a flow diagram that describes an interconnect metallization process, which corresponds to FIGS. 1 and 2.

FIGS. 1 and 2 illustrate a side cross-sectional view of a portion of a dielectric layer 100 in different stages of an interconnect metallization process. FIG. 3 illustrates a flow diagram 200 that describes an interconnect metallization process, which corresponds to FIGS. 1 and 2.

FIG. 1 illustrates a dielectric layer 100 that includes a via 102, which is an open passageway that extends from a top surface to a bottom surface of dielectric layer 100. Via 102 is formed above a conductive layer 104, such as a conductive substrate, a conductive trace, or another via. The shape of the passageway of via 102 can be, for example, cylindrical, rectangular, and oval. Via 102 has two sections wherein the upper portion has a larger diameter than the diameter of the lower portion. In alternative embodiments, the diameter of via 102 can vary according to different design layouts.

The surface of via 102 is covered by an integrated barrier and seed layer 106, which includes a barrier region 108 and a seed region 110. Barrier region 108 and seed region 110 generally form the lower and upper layers, respectively, of integrated barrier and seed payer 106.

FIG. 2 illustrates the dielectric layer 100 of FIG. 1 after via 102 has been filled with a conductive material to form an interconnect 112. Interconnect 112 provides for an electrical pathway to transmit signals through the thickness of a dielectric layer 100. The barrier region 108 of the integrated barrier and seed layer 106 acts to prevent diffusion of the interconnect material 112 into dielectric layer 100. Seed region 110 provides a surface upon which conductive material 112 can be bonded. As such, conductive material 112 can fill and be securely bonded within via 102.

Dielectric layer 100 supports many interconnects 112 and also supports partially recessed trenches (not shown). The surfaces of the recessed trenches are also lined with integrated barrier and seed layer 106 so that a conductive material can fill the trenches to form conductive traces.

Dielectric layer 100 typically is formed above a semiconductor substrate that includes integrated electrical devices, such as transistors. Interconnects 112 and the conductive traces provide for interconnectivity between such electronic devices. Multiple dielectric layers 100 may be stacked upon each other to provide a network of conductive pathways. Conductive layer 104 may be a via or trace of an underlying dielectric layer, or a portion of a semiconductor substrate.

The flow diagram 200 of FIG. 3 begins at block 202 where vias and trenches are formed in the surface of a dielectric layer 100. Vias, as shown in FIGS. 1 and 2, are passageways that lead from a top surface to a bottom surface of a dielectric layer. As will be described with respect to block 208 a conductive metal 112 will fill each via 102 to form a electrically conductive, vertical interconnect 112. Trenches are recessed channels that run along the surface of a dielectric layer 100. Conductive material also will fill the trenches to form electrically conductive traces. The vertical interconnects 112 connect with the traces to form a network of electrical pathways throughout dielectric layer 100. Vias 102 and the trenches are formed through commonly understood techniques such as chemical or dry etching. Photolithographic techniques are also used to control the etching pattern.

Block 204 initiates the deposition of the integrated barrier and seed layer according to one embodiment of the present invention. In block 204, the barrier portion of the integrated barrier and seed layer is deposited onto the surface of dielectric layer 100. The barrier portion is formed of ruthenium-tantalum-nitride (Ru—Ta—N). The Ru—Ta—N typically covers the entire dielectric layer 100 including the newly etched surfaces of vias 102 and the trenches. Ru—Ta—N forms an effective barrier layer to prevent the diffusion of a conductive metal, such as copper, into the surface of dielectric layer 100. The nitrogen content in the barrier region 108 causes the atomic structure to pack tightly and thereby act as an effective barrier layer. As shown in FIG. 1, barrier region 108 forms the first layer upon the surface of via 102.

Integrated barrier and seed layer 106 may be deposited using commonly known deposition processes such as, but not limited to, So-gel deposition, physical vapor deposition, chemical vapor deposition, and atomic layer deposition. For example, the Ru—Ta—N barrier region 108 may be formed by using a Ru—Ta target to deposit Ru—Ta in a nitrogen-argon gas mixture.

In some embodiments, a patterned and developed photoresist mask may be used to selectively cover areas of dielectric layer 100 that should not be covered with Ru—Ta—N, or any other barrier material. For example, the photoresist mask would expose vias 102 for deposition purposes.

Block 206 continues the deposition of the integrated barrier and seed layer 106 while transitioning the material being deposited to Ru—Ta. The Ru—Ta is deposited to form the seed region 110 of integrated layer 106. Ru—Ta forms a seed layer for a conductive material 112 such as copper. A single phase Ru—Ta alloy is obtained when the atomic % concentration of Ta is between 40 to 60%. Substantially uniform copper plating is achievable with single phase Ru—Ta alloy since Ru atoms are uniformly distributed on the alloy surface. Furthermore, copper adheres to Ta very well, so the addition of Ta does not compromise the adhesion between plated copper and barrier region 110.

The transition of material deposition is initiated by removing the nitrogen from the deposition chamber, for example, by turning off the supply of nitrogen gas while maintaining the same flow of argon gas. The rate of shutting off the nitrogen supply may be gradual so that the composition of the integrated layer 106 gradually decreases in nitrogen content as the barrier region 108 transitions into the seed region 110. A region between barrier region 108 and seed region 110 where the nitrogen content gradually decreases is referred to as a transition region or layer. The gradual change in material composition in the transition layer reduces internal stresses at the interface between the barrier region 108 and the seed region 110. The gradient of nitrogen content can be controlled by the rate at which nitrogen is removed from the deposition process. The gradient region allows for fine-tuning of stress levels within the integrated barrier and seed layer.

Integrated barrier and seed layer 106 can advantageously be deposited within a single deposition tool. For example, a single deposition tool containing a Ru—Ta target can be used to deposit Ru—Ta in a nitrogen atmosphere when depositing the barrier region 108. Then, by simply shutting down a nitrogen supply, a seed region 110 of Ru—Ta can be deposited to form the seed region 110. The ability to use a single tool greatly increases manufacturing efficiency and throughput. For example, there is no need to transfer a semiconductor device between two different deposition tools. Deposition of a Ru—Ta seed region 110 is also advantageous because this material can be formed to be very thin.

In some embodiments, each of barrier and seed regions 108 and 110 have a thickness of approximately 1-10 nm. In other embodiments, each region can be thinner than 1 nm or thicker than 10 nm.

In block 208, a conductive material is deposited onto integrated barrier and seed layer 106 such that the conductive material bonds with seed region 110 of integrated layer 106. Again the conductive material forms an interconnect 112. For example, a copper conductive material can be deposited directly onto the Ru—Ta seed region 110. The copper is deposited until via 102 is filled. The trenches in dielectric layer 100 are also filled with the copper. Copper can be deposited through commonly known techniques such as electroplating and physical or chemical vapor deposition.

In block 210, a backpolishing process is performed to polish areas of conductive material 112 that overfill each of vias 102 and/or the trenches of dielectric layer 100. The resulting structure is an interconnect 112 having a top surface that is flush with the top surface of dielectric layer 100.

Figure 4:
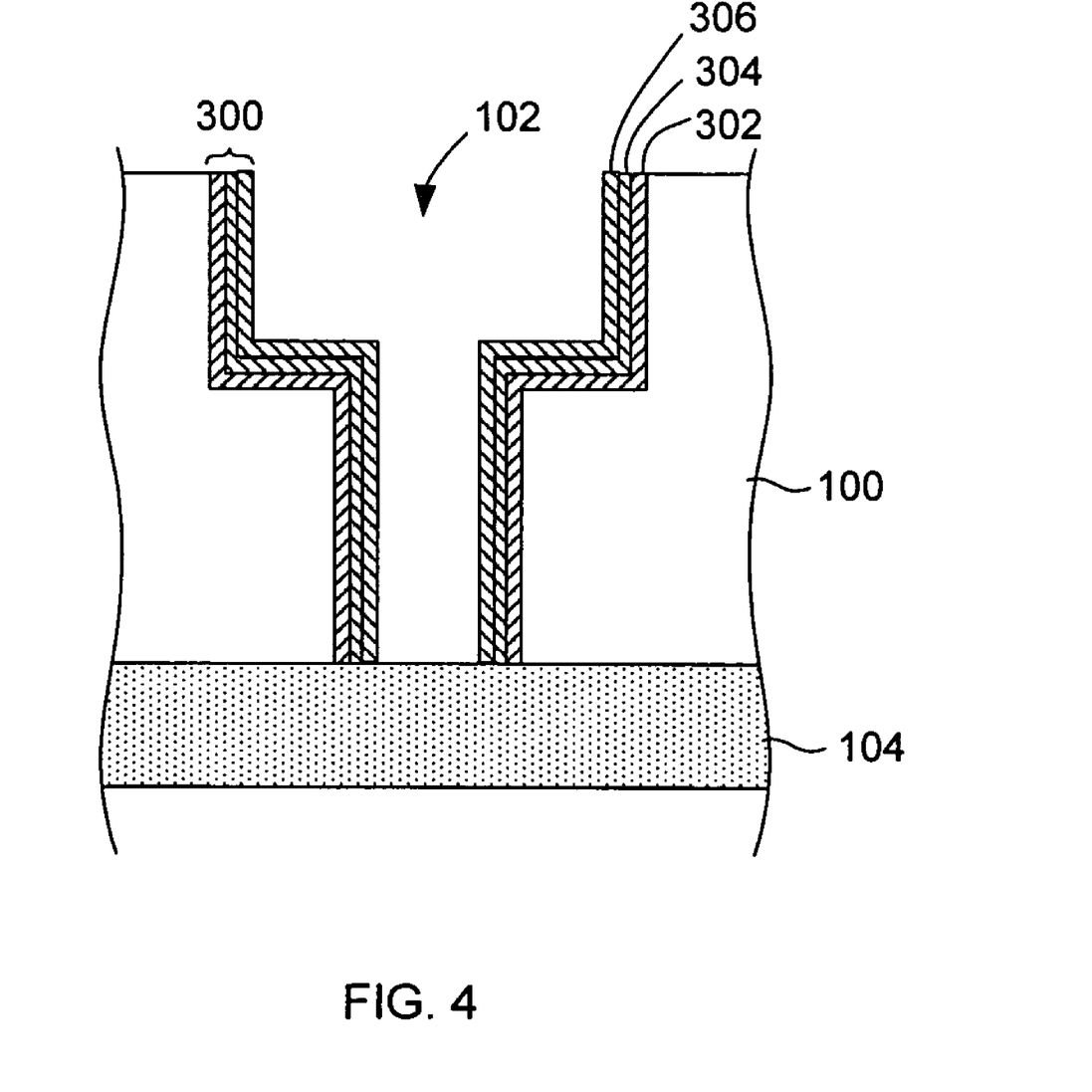
FIG. 4 illustrates a side, cross-sectional view of a via that is covered with an integrated barrier and seed layer according to an alternative embodiment of the present invention.
Figure 5:
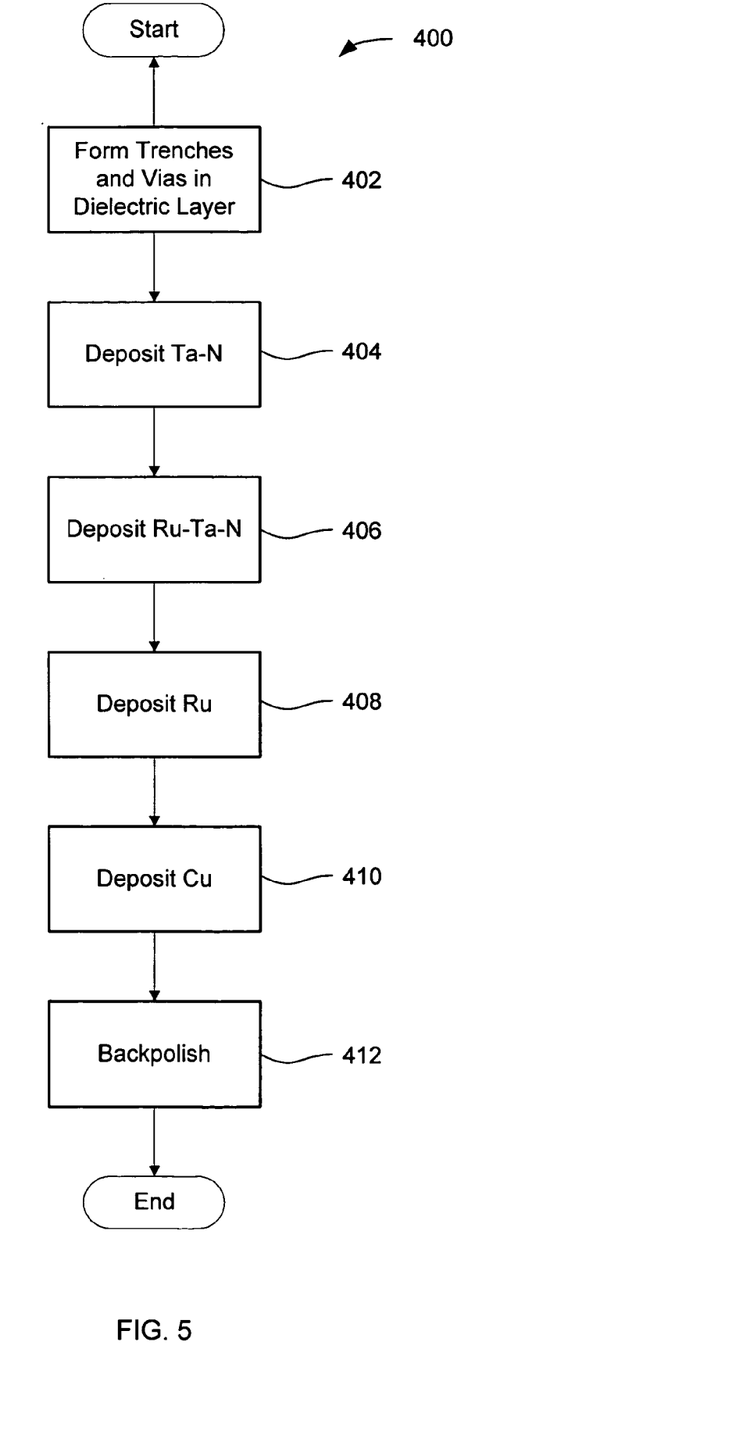
FIG. 5 illustrates a flow diagram that describes an interconnect metallization process, which corresponds to FIG. 4.

FIG. 4 illustrates a side, cross-sectional view of a via 102 that is covered with an integrated barrier and seed layer 300 according to an alternative embodiment of the present invention. FIG. 5 illustrates a flow diagram 400 that describes an interconnect metallization process, which corresponds to FIG. 4. Dielectric layer 100 may also include recessed trenches in addition to via 102.

Integrated barrier and seed layer 300 includes a barrier region 302, a transition region 304, and a seed layer 306. Barrier region 102 of the integrated barrier and seed layer 300 acts to prevent diffusion of a conductive material into dielectric layer 100. Seed region 306 provides a surface upon which a conductive material can be bonded. As such, a conductive material can fill and be securely bonded within via 102.

The flow diagram 400 of FIG. 4 begins at block 402 where vias and trenches are formed in the surface of a dielectric layer 100.

Block 404 initiates the deposition of the integrated barrier and seed layer 300 according to one embodiment of the present invention. In block 402, the barrier region 302 of the integrated barrier and seed layer 300 is deposited onto the surface of dielectric layer 100. The barrier portion is formed of tantalum-nitride (Ta—N). The Ta—N typically covers the entire dielectric layer 100 including the newly etched surfaces of vias 102 and the trenches. Ta—N forms an effective barrier layer to prevent the diffusion of a conductive metal, such as copper, into the surface of dielectric layer 100. As shown in FIG. 1, barrier region 302 forms the first layer upon the surface of via 102. TaN tends to adhere better to a silicon oxide base dielectric than Ru.

Integrated barrier and seed layer 106 may be deposited using commonly known deposition processes such as, but not limited to, So-gel deposition, physical vapor deposition, chemical vapor deposition, and atomic layer deposition. For example, a Ta target may be used to deposit Ta in a nitrogen argon gas mixture to form the Ta—N barrier region 308.

Barrier region 302 can be deposited by reacting a Ta precursor, e.g., tantalum chloride or tantalum ethoxide, with ammonia or nitrous oxide using an atomic layer deposition technique. Once the desirable TaN thickness is achieved, the deposition process proceeds to operation 406.

Atomic layer deposition is an effective technique to deposit a very thin integrated barrier seed layer 300. Atomic layer deposition (ALD) is advantageous because it can precisely control the composition of each atomic layer, thereby making ALD processes easily optimized for film stack performance. Therefore, ALD processes are adept at forming metal layers with many different material types. For example, ALD processes can use as many element sources as desired so one can switch from one compound to next just by switching off and on the element sources needed. For example, one can form a continuous film stack of Al—Ti—O/ZnS:Mn/Si—O using an ALD tool plumbed with sources for Al, Ti, Zn, Mn, Si, $H_2O$ (the oxygen source) and $H_2S$ (the sulfur source). To make the same film stack with sputtering techniques, three separate chambers would be required; one for Al—Ti—O, one for ZnS:Mn and another one for SiO. ALD also is the preferred technique for future generation technologies due to its capability of depositing atom-thin, uniform and conformal films in fine geometries.

Block 406 continues the deposition of the integrated barrier and seed layer 300 while transitioning the material being deposited to Ru—Ta—N. The Ru—Ta—N is deposited to form a transition region 304 of integrated layer 300. Ru—Ta—N is deposited by adding Ru to the deposition process of block 404. This can be done, for example, by adding an Ru precursor, e.g., bis(ethylcyclopentadienyl) ruthenium $(Ru(EtCp)_2)$ and oxygen The oxygen flow is adjusted so only an Ru layer is formed (and not $RuO_2$).

In a similar manner as described above, Ru can be added into the deposition process in a gradual manner to create a gradient within integrated layer 300 where the Ru content increases gradually. As a note, the ternary compound of Ru—Ta—N possess approximately the same excellent copper barrier property as TaN due to the formation of densely packed face center cubic or hexagonal structure.

In block 408, Ru is deposited to form a seed region 306 above transition region 304. Ru forms seed region 306, upon which copper can be deposited to fill vias 102 and trenches within dielectric layer 100. Seed region 306 is deposited by gradually decreasing the amount of tantalum and nitrogen being deposited during block 406. By gradually turning off the supply of tantalum and nitrogen, a gradient in transition region 304 is formed. The gradient continues until the tantalum and nitrogen supply are completely turned off. At this point, the deposition process reaches block 408 where substantially pure ruthenium is deposited. As described above, the gradient of material composition alleviates stress levels between the interface between interface region 304 and seed region 306.

In some embodiments, the tantalum and nitrogen can be turned off gradually at the same time until pure ruthenium is deposited. In other embodiments, the nitrogen and then tantalum can be turned off sequentially where the tantalum or the nitrogen can be turned off first.

In block 410, a conductive material is deposited onto integrated barrier and seed layer 300 such that the conductive material bonds with the seed region 306 of integrated layer 300. For example, copper can be deposited directly onto the Ru seed region 306. Copper is deposited until via 102 is filled and an interconnect is formed. The trenches in dielectric layer 100 are also filled with the copper to form traces.

In block 412, a backpolishing process is performed to polish the portions of the conductive material that overfill each of vias 102 and/or the trenches of dielectric layer 100.

In an alternative embodiment, multiple transition regions 304 may be formed and each transition region may be formed of a different combination of materials. Multiple transition regions 304 may be useful for minimizing internal stress levels. However, it is desirable to minimize the thickness of integrated barrier and seed layer 300 even when multiple transition layers 304 are used.

In some embodiments, each of barrier 302, transition 304, and seed regions 306 have a thickness of approximately 1-10 nm. In other embodiments, each region can be thinner than 1 nm or thicker than 10 nm. In yet other embodiments, the total thickness of integrated barrier and seed layer 300 is approximately in the range of 3-10 nm. Atomic layer deposition processes are suitable for forming even thinner integrated layers 300.

In alternative embodiments, other materials such as titanium, tungsten, zirconium, niobium, vanadium, haffnium, and other transition metals can be used to form barrier regions of an integrated barrier and seed layer. For example, one or more of these materials can substitute for or be used in addition to tantalum to create a metal nitride barrier region. One or more of these materials can also be combined with Ru to form a seed region 306 formed of Ru-alloy.

In many semiconductor devices, multiple dielectric layers that each support electrically conductive traces and vias are stacked upon each other. The interconnect fabrication technique of the present invention can be implemented within each dielectric layer or selected layers.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A method for fabricating an integrated barrier and seed layer comprising:
   providing a dielectric layer having a plurality of recessed vias and trenches;
   depositing a metal nitride over a surface of each of the vias and trenches to form a barrier layer, wherein the metal nitride that forms the barrier layer is a ruthenium-tantalum-nitride; and depositing a ruthenium or a ruthenium alloy over the barrier layer to form a seed layer, wherein the operations of depositing the barrier layer and the seed layer are performed with a single deposition.

2. A method as recited in claim 1 wherein the seed layer is formed of a ruthenium-tantalum alloy.

3. A method as recited in claim 2 wherein the barrier and seed layer are deposited using a physical vapor deposition, a chemical vapor deposition, or an atomic layer deposition technique.

4. A method as recited in claim 2 further comprising:
gradually reducing the amount of nitrogen and the amount of tantalum during the deposition of the metal nitride of the barrier layer such that a transitional layer is formed between the barrier layer and the seed layer and wherein the transitional layer gradually transitions from a metal nitride in the region adjacent to the barrier layer to a ruthenium or ruthenium alloy in the region adjacent to the seed layer.

5. A method as recited in claim 4 wherein the amount of nitrogen is gradually reduced by gradually turning off a supply of nitrogen gas into the deposition chamber.

6. A method as recited in claim 2 further comprising:
depositing copper onto the seed layer such that copper fills at least some of the vias and trenches, wherein the copper forms electrically conductive pathways within each copper filled via and trench.

7. A method as recited in claim 6 further comprising:
backpolishing the copper deposited onto the seed layer to form a substantially smooth surface on top of the dielectric layer.

8. A method as recited in claim 1 wherein the operation of depositing the baffler layer forms a barrier layer having a thickness in the range of approximately 1-10 nm.

9. A method as recited in claim 1 wherein the operation of depositing the seed layer forms a seed layer having a thickness in the range of approximately 1-10 nm.

10. A method as recited in claim 1 wherein the copper seed layer is formed of substantially pure ruthenium.

11. A method as recited in claim 1 wherein the dielectric layer is formed upon a semiconductor wafer substrate.

12. A method as recited in claim 1 wherein the operations of depositing the barrier layer and the seed layer are performed in a single deposition chamber of the deposition tool.

13. A method for fabricating an integrated barrier and seed layer comprising:
providing a dielectric layer having a plurality of recessed vias and trenches;
depositing a metal nitride over a surface of each of the vias and trenches to form a barrier layer wherein the metal nitride that forms the barrier layer is a tantalum-nitride;
depositing a substantially pure ruthenium layer over the barrier layer to form a seed layer, wherein the operations of depositing the barrier layer and the seed layer are performed with a single deposition tool; and
forming a transition layer formed of a ruthenium-tantalum-nitride between the barrier layer and the seed layer by depositing a ruthenium-tantalum-nitride after the operation of depositing the barrier layer and before the operation of depositing the seed layer.

14. A method as recited in claim 13 wherein the barrier and seed layer are deposited using an atomic layer deposition, physical vapor deposition, or a chemical vapor deposition technique.

15. A method as recited in claim 13 further comprising:
near the end of the operation of depositing the tantalum-nitride of the barrier layer, introducing and gradually increasing the amount of ruthenium being deposited such that the material composition of a top region of the barrier layer that is adjacent to the transition layer gradually increases in ruthenium content.

16. A method as recited in claim 15 further comprising:
near the end of the operation of depositing the ruthenium-tantalum-nitride of the transition layer, gradually decreasing the amount of tantalum and nitrogen being deposited such that the material composition of a top region of the transition layer that is adjacent to the seed layer gradually decreases in tantalum and nitrogen content.

17. A method as recited in claim 13 further comprising:
depositing copper onto the seed layer such that copper fills at least some of the vias and trenches, wherein the copper forms electrically conductive pathways within each copper filled via and trench.

18. A method as recited in claim 17 further comprising:
backpolishing the copper deposited onto the seed layer to form a substantially smooth surface on top of the dielectric layer.

19. A semiconductor device comprising:
a semiconductor substrate that contains integrated circuits;
a dielectric layer formed above the semiconductor substrate, the dielectric layer having a plurality of recessed vias and trenches;
an integrated barrier and seed layer that covers a surface of each of the vias and trenches, the integrated barrier and seed layer having a barrier region that is formed adjacent to the surface of the dielectric layer and a seed region that is formed above the barrier region, the barrier region being formed of a ruthenium tantalum nitride and the seed region being formed of a ruthenium tantalum alloy wherein the composition of integrated barrier and seed layer gradually transitions from the ruthenium tantalum nitride of the barrier region to the ruthenium tantalum alloy of the seed region.

20. A semiconductor device as recited in claim 19 wherein the barrier region and the seed region of the integrated barrier and seed layer are each approximately 1-10 nm in thickness, respectively.

21. A semiconductor device comprising:
a semiconductor substrate that contains integrated circuits;
a dielectric layer formed above the semiconductor substrate, the dielectric layer having a plurality of recessed vias and trenches; and
an integrated barrier and seed layer that covers a surface of each of the vias and trenches, the integrated barrier and seed layer having a barrier region that is formed adjacent to the surface of the dielectric layer, a transition region formed above the barrier region, and a seed region formed above the transition region, the barrier region being formed of a tantalum-nitride, the transition region formed of a ruthenium-tantalum-nitride, and the seed region being formed of substantially pure ruthenium.

22. A semiconductor device as recited in claim 21 wherein a bottom layer of the transition region gradually changes in composition from tantalum-nitride to ruthenium-tantalum-nitride.

23. A semiconductor device as recited in claim 22 wherein a top layer of the transition region gradually changes in composition from ruthenium-tantalum-nitride to substantially pure ruthenium.

24. A method for fabricating an integrated barrier and seed layer comprising:

provyiding a dielectric layer having a plurality of recessed vias and trenches;

forming an integrated baffler and seed layer over at least each of the vias and trenches by, first, depositing a metal nitride comprising ruthenium-tantalum-nitride to form a barrier region, and second, depositing a ruthenium-tantalum alloy over the barrier region to form a seed region, wherein the first and second depositing operations are performed in a single deposition chamber.

* * * * *